United States Patent [19]

Lewandowski

[11] 4,151,493
[45] Apr. 24, 1979

[54] NEGATIVE IMPEDANCE CONVERTERS

[75] Inventor: Ted J. Lewandowski, Arnprior, Canada

[73] Assignee: Northern Telecom Limited, Montreal, Canada

[21] Appl. No.: 838,761

[22] Filed: Oct. 3, 1977

[51] Int. Cl.² ............................................. H03H 7/00
[52] U.S. Cl. .................................. 333/216; 307/295; 333/217
[58] Field of Search ......................... 333/80 R, 80 T; 307/295, 324

[56] References Cited

U.S. PATENT DOCUMENTS 2,788,496  4/1957  Linvill .............................. 333/80 R

OTHER PUBLICATIONS

Sancholuz, Current Inversion Impedance Converter Using Operational Amplifiers, Rev. Sci. Instrum., vol. 47, No. 11, 11/76, pp. 1407–1409.

Primary Examiner—Paul L. Gensler
Attorney, Agent, or Firm—Achmed N. Sadik

[57] ABSTRACT

An improved negative impedance converter is provided comprising an additional differential operational amplifier to improve signal handling capability.

6 Claims, 1 Drawing Figure

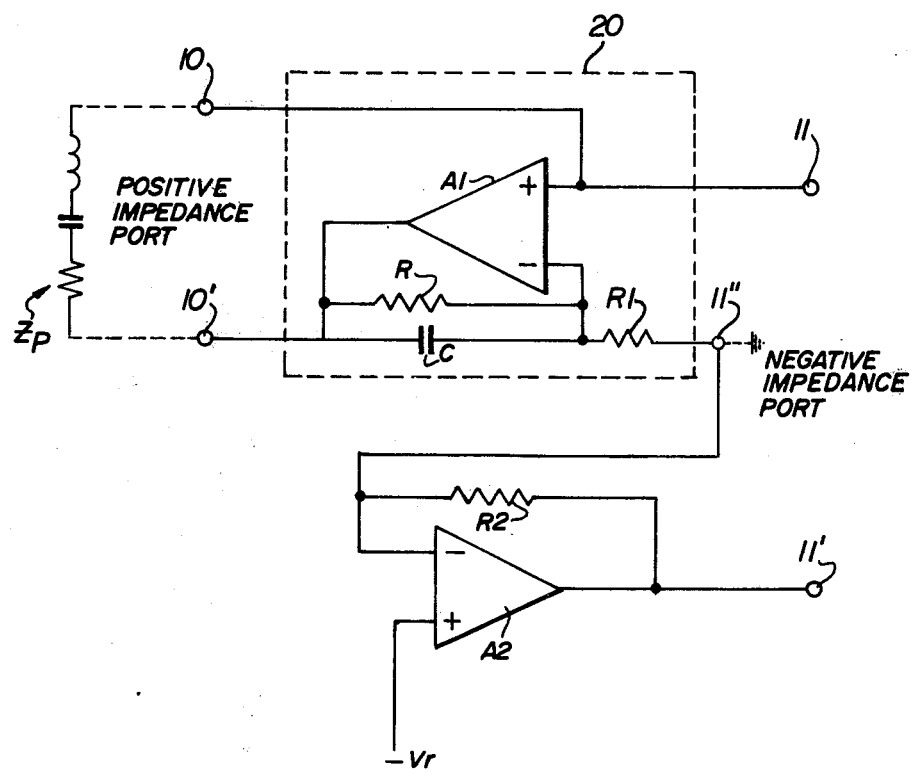

NEGATIVE IMPEDANCE CONVERTERS

FIELD OF THE INVENTION

The present invention relates to negative impedance converters in general, and in particular to an improvement permitting larger signal handling capability.

BACKGROUND AND SUMMARY OF THE INVENTION

A negative impedance converter (NIC) is an active circuit device by means of which a passive arbitrary impedance may be transformed into its algebraic negative. For intance, a capacitor converted to the appropriate port of a NIC causes its other port to appear as a negative capacitor. This, of course, at certain frequencies determined by the bandwidth of the active components and other circuit parameters. Such devices are well known in the art.

The improvement of the present invention does not directly alter the operation of the otherwise known NIC circuit itself, although, of course, interaction therewith is unavoidable. By using an additional active device, an operational amplifier, the signal handling capability of the NIC is enhanced; the improved NIC circuit can handle a signal with greater amplitude.

Thus, according to the present invention there is provided an improved negative impedance converter comprising a conventional negative impedance converter having a negative impedance port and a positive impedance port, a differential operational amplifier having an inverting input and a non-inverting input and an output, said inverting input receiving one side of said negative impedance port, said non-inverting input receiving a reference voltage, and said output forming, with the other side of said negative impedance port, the output of said improved negative impedance converter.

In a preferred aspect of the present invention, said differential operational amplifier has its output and its inverting input interconnected with circuit means to provide a gain factor of minus one.

Such an improved negative impedance converter is utilized in the invention subject of copending application Ser. No. 824,659 filed in the name of Nachum Lichtenstein and having the assignee of the present application in common.

BRIEF DESCRIPTION OF THE DRAWING

A preferred embodiment will now be described by way of example in conjunction with the accompanying drawing which depicts an improved negative impedance converter according to the present invention.

DESCRIPTION OF THE PREFERRED EMBODIMENT

With reference to the drawing, the improved negative impedance converter (NIC) comprises a conventional NIC 20 having a positive impedance port consisting of terminals 10 and 10', between which a network $Z_p$ of passive circuit components, such as resistors, inductors and capacitors, may be connected, the negative impedance of which is desired. Thus a resistor between the terminals 10 and 10' would appear between terminals 11 and 11' as a negative resistance. Similarly, a capacitor would appear as an inductor and vice versa. Terminal 11'' of the NIC 20 is conventionally connected to the common or ground reference, but since the improved NIC of the present invention is floating, i.e. without reference to a common or ground terminal, this terminal 11'' is now connected to the inverting input of an operational amplifier A2. The NIC 20 as shown in the drawing, comprising operational amplifier A1, resistor R and capacitor C, as well as resistor R1, is well known in the art. These impedance components (R, R1 AND C) may, in general, be complex impedances. Also the input terminals of the amplifier A1 may be interchanged, depending on whether a short circuit or open circuit stable NIC is desired. As shown in the drawing, the NIC 20, and hence the total improved NIC, is short/open circuit stable. Between the inverting input of the amplifier A2 and its output a feedback resistance R2 is connected. The non-inverting input of the amplifier A2 is connected to a reference voltage $-V_r$, and, unlike the low impedance ground that was necessary for connection to the terminal 11'', this reference voltage does not have to be a low impedance source. For instance, a 10 kilohm reference source is adequate. The output of the amplifier A2 at terminal 11' forms with the terminal 11 the output or negative impedance port of the improved NIC. The port 11/11' has improved signal handling capability compared to the port 11/11'' of the NIC 20. In addition, the port 11/11' is floating, which is an advantage in some applications. These two advantages, it should be noted, can be achieved by using a transformer stepping down the signal voltage to the port 11/11''. Transformers, however, are expensive and bulky for voice frequency (VF) applications for which this preferred embodiment is envisaged in the formerly mentioned copending application. The resistor R2 may also be a complex impedance, and in general the impedance Z11 at the port 11/11' is given by:

$$Z11 = -[Z_P(R1+R2)/Z3]$$

where Z3 is the impedance of the parallel connection of the resistor R and the capacitor C. If R1 and R2 were complex impedances, the appropriate impedances should be substituted in the above equation (i.e. in general $Z11 = -[Z_p(Z1+Z2)/Z3]$).

Typical values for the present preferred embodiment are as follows:

- $-V_r = 15$ volts,
- R = 20 kilohm,
- R1 = 10 kilohm,
- R2 = 10 kilohm, and
- C = 470 picofarads.

Since the capacitor C is only utilized to prevent high frequency oscillations, the factor (R1+R2)/Z3 in the above formula for Z11 substantially equals unity. Hence, whatever impedance Zp is connected between the terminals 10 and 10' is converted to its negative appearing between the terminals 11 and 11'. Therefore, the choice of the impedance Zp depends on the application and is at the discretion of the designer.

What is claimed is:

1. An improved negative impedance converter comprising: a conventional negative impedance converter having a negative impedance port and a positive impedance port; a first differential operational amplifier having an inverting input and a non-inverting input and an output; said inverting input receiving one side of said negative impedance port; said non-inverting input receiving a reference voltage; and said output forming, with the other side of said negative impedance port, the output of said improved negative impedance converter.

2. The improved negative impedance converter of claim 1, said conventional negative impedance converter comprising a second differential operational amplifier having two inputs and an output, wherein one of said two inputs together with the output form said positive impedance port, and wherein said one of said two inputs being said other side of said negative impedance port.

3. The improved negative impedance converter of claim 2, said inverting inputs of said first and second operational amplifiers being interconnected by first impedance circuit means; said output and said inverting input of said second operational amplifier being interconnected by second impedance circuit means Z3.

4. The improved negative impedance converter of claim 3, said first differential operational amplifier having its output and its inverting input interconnected with third impedance circuit means Z2 to provide a gain factor of minus one.

5. The improved negative impedance converter of claim 4, wherein (Z1+Z2)/Z3 equals unity.

6. The improved negative impedance converter of claim 5, said impedance circuit means Z1, Z2 and Z3 being substantially resistive.

* * * * *